United States Patent
Katz et al.

(10) Patent No.: US 7,371,605 B2
(45) Date of Patent: May 13, 2008

(54) ACTIVE ORGANIC SEMICONDUCTOR DEVICES AND METHODS FOR MAKING THE SAME

(75) Inventors: Howard Edan Katz, Summit, NJ (US); Masato Ofuji, Kanagawa (JP)

(73) Assignee: Lucent Technologies Inc., Murray Hill, NJ (US)

( * ) Notice: Subject to any disclaimer, the term of this patent is extended or adjusted under 35 U.S.C. 154(b) by 286 days.

(21) Appl. No.: 11/095,014

(22) Filed: Mar. 31, 2005

(65) Prior Publication Data

US 2006/0216910 A1 Sep. 28, 2006

Related U.S. Application Data

(60) Provisional application No. 60/665,245, filed on Mar. 25, 2005.

(51) Int. Cl.
*H01L 51/40* (2006.01)
(52) U.S. Cl. ............................ 438/99; 438/82; 438/780
(58) Field of Classification Search ................. 438/82, 438/99, 780, 781
See application file for complete search history.

(56) References Cited

U.S. PATENT DOCUMENTS

| | | | |
|---|---|---|---|
| 5,347,144 A | 9/1994 | Garnier et al. | 257/40 |
| 5,625,199 A | 4/1997 | Baumbach et al. | 257/40 |
| 5,981,970 A | 11/1999 | Dimitrakopoulos et al. | 257/40 |
| 6,114,088 A | 9/2000 | Wolk et al. | 430/273.1 |
| 7,122,828 B2 * | 10/2006 | Bao et al. | 257/40 |
| 2005/0072971 A1 * | 4/2005 | Marrocco et al. | 257/40 |
| 2005/0125067 A1 * | 6/2005 | Sweeney | 623/19.14 |
| 2006/0223208 A1 * | 10/2006 | Patel et al. | 438/29 |

OTHER PUBLICATIONS

Afzali et al., "Photosensitive Pentacene Precursor: Synthesis, Photothermal Patterning, and Application in Thin-Film Transistors", *Adv. Mater.*, vol. 15, No. 24, pp. 2066-2069 (Dec. 17, 2003).
Alam et al., "A Two-Dimensional Simulation of Organic Transistors", *IEEE Transactions on Electron Devices*, vol. 44, No. 8, pp. 1332-1337 (Aug. 1997).
Bao et al., "Organic field-effect transistors with high mobility based on copper phthalocyanine", *Appl. Phys. Lett.*, vol. 69, No. 20, pp. 3066-3068 (Nov. 11, 1996).
Blanchet et al., "Large area, high resolution, dry printing of conducting polymers for organic electronics", *Applied Physics Letters*, vol. 82, No. 3, pp. 463-465 (Jan. 20, 2003).
Blanchet et al., "Polyaniline nanotube composites: A high-resolution printable conductor", *Applied Physics Letters*, vol. 82, No. 8, pp. 1290-1292 (Feb. 24, 2003).

(Continued)

*Primary Examiner*—Sheila V. Clark

(57) ABSTRACT

Techniques for disposing an organic semiconductor film on a receiver substrate, comprising the steps of: depositing an organic semiconductor film onto a donor substrate, the semiconductor film having a first surface facing the donor substrate and having an exposed second surface; bringing the exposed second surface adjacent a receiver substrate such that the semiconductor film is in contact with both substrates; and then, moving the donor and receiver substrates apart; and wherein a surface portion of the receiver substrate is maintained above its glass transition during the moving step. Active organic semiconductor devices.

14 Claims, 9 Drawing Sheets

OTHER PUBLICATIONS

Brandon et al., "Carbon-based printed contacts for organic thin-film transistors", *Applied Physics Letters*, vol. 83, No. 19, pp. 3945-3947 (Nov. 10, 2003).

Dodabalapur et al., "Organic Transistors: Two-Dimensional Transport and Improved Electrical Characteristics", *Science*, vol. 268, pp. 270-271 (Apr. 14, 1995).

Forrest, Stephen R., "The path to ubiquitous and low-cost organic electronic appliances on plastic", *Nature*, vol. 428, pp. 911-918 (Apr. 29, 2004).

Forrest, Stephen R., "Ultrathin Organic Films Grown by Organic Molecular Beam Deposition and Related Techniques", *Chem. Rev.*, vol. 97, pp. 1793-1896 (1997).

Gelinck et al., "Flexible active-matrix displays and shift registers based on solution-processed organic transistors", *Nature Materials*, vol. 3, pp. 106-110 (Feb. 2004).

Gundlach et al., "Solvent-induced phase transition in thermally evaporated pentacene films", *Applied Physics Letters*, vol. 74, No. 22, pp. 3302-3304 (May 31, 1999).

Gundlach et al., "Pentacene Organic Thin-Film Transistors-Molecular Ordering and Mobility", *IEEE Electron Device Letters*, vol. 18, No. 3, pp. 87-89 (Mar. 1997).

Hong et al., "Thiophene-Phenylene and Thiophene-Thiazole Oligomeric Semiconductors with High Field-Effect Transistor On/Off Ratios", *Chem. Mater.*, vol. 13, pp. 4686-4691 (2001).

Horowitz et al., "Mobility in Polycrystalline Oligothiophene Field-Effect Transistors Dependent on Grain Size", *Adv. Mater.*, vol. 12, No. 14, pp. 1046-1050 (Jul. 19, 2000).

Kang et al., "Influence of postannealing on polycrystalline pentacene thin film transistor", *Journal of Applied Physics*, vol. 95, No. 5, pp. 2293-2296 (Mar. 1, 2004).

Karnakis et al., "Laser induced molecular transfer using ablation of a triazeno-polymer", *Applied Surface Science*, vol. 127-129, pp. 781-786 (1998).

Kato et al., "High mobility of pentacene field-effect transistors with polyimide gate dielectric layers", *Appied Physics Letters*, vol. 84, No. 19, pp. 3789-3791 (May 10, 2004).

Katz, Howard E., "Recent Advances in Semiconductor Performance and Printing Processes for Organic Transistor-Based Electronics", *Chem. Mater.*, vol. 16, pp. 4748-4756 (2004).

Kelley et al., "Recent Progress in Organic Electronics: Materials, Devices, and Processes", *Chem. Mater.*, vol. 16, pp. 4413-4422 (2004).

Kim et al., "Micropatterning of Organic Electronic Devices by Cold-Welding", *Science*, vol. 288, pp. 831-833 (May 5, 2000).

Klauck et al., "Pentacene organic thin-film transistors and IC's," *Solid State Technology*, vol. 43, Issue 3, pp. 63-76 (Mar. 2000).

Knobloch et al., "Fully printed integrated circuits from solution processable polymers", *Journal of Applied Physics*, vol. 96, No. 4, pp. 2286-2291 (Aug. 15, 2004).

Kymissis et al., "Patterning pentacene organic thin film transistors", *J. Vac. Sci. Technol. B*, vol. 20, No. 3, pp. 956-959 (May/Jun. 2002).

Laudise et al., "Physical vapor growth of organic semiconductors", *Journal of Crystal Growth*, vol. 187, pp. 449-454 (1998).

Li et al., "Field-Effect Transistors Based on Thiophene Hexamer Analogues with Diminished Electron Donor Strength", *Chem. Mater.*, vol. 11, pp. 458-465 (1999).

Lin et al., "Pentacene-Based Organic Thin-film Transistors", *IEEE Transactions on Electron Devices*, vol. 44, No. 8, pp. 1325-1331 (Aug. 1997).

Lin et al., "Stacked Pentacene Layer Organic Thin-Film Transistors with Improved Characteristics", *IEEE Electron Device Letters*, vol. 18, No. 12, pp. 606-608 (Dec. 1997).

Mushrush et al., "Easily Processable Phenylene—Thiophene-Based Organic Field-Effect Transistors and Solution-Fabricated Nonvolatile Transistor Memory Elements", *J. Am. Chem. Soc.*, vol. 125, pp. 9414-9423 (2003).

Ofuji et al., "Growth Process of Vacuum Deposited Copper Phthalocyanine Thin Films on Rubbing-Treated Substrates", *Jpn. J. Appl. Phys.*, vol. 42, pp. 7520-7524 (2003).

Paul et al., "Additive jet printing of polymer thin-film transistors", *Applied Physics Letters*, vol. 83, No. 10, pp. 2070-2072 (Sep. 8, 2003).

Ruiz et al., "Pentacene Thin Film Growth", *Chem. Mater.*, vol. 16, pp. 4497-4508 (2004).

Sirringhaus et al., "High-Resolution Inkjet Printing of All-Polymer Transistor Circuits", *Science*, vol. 290, pp. 2123-2126 (Dec. 15, 2000).

Suh et al., "Enhanced Luminance of Blue Light-Emitting Polymers by Blending with Hole-Transporting Materials", *Adv. Mater.*, vol. 15, No. 15, pp. 1254-1258 (Aug. 5, 2003).

Wang et al., Micropatterning of metal films coated on polymer surfaces with epoxy mold and its application to organic field effect transistor fabrication, *Applied Physics Letters*, vol. 85, No. 5, pp. 831-833 (Aug. 2, 2004).

Wang et al., Micropatterning of Organic Semiconductor Microcrystalline Materials and OFET Fabrication by 'Hot Lift Off', *J. Am. Chem. Soc.*, vol. 125, pp. 15278-15279 (2003).

* cited by examiner

ACTIVE ORGANIC SEMICONDUCTOR DEVICES AND METHODS FOR MAKING THE SAME

This application claims priority to U.S. provisional patent application Ser. No. 60/665,245, filed by Howard Edan Katz and Masato Ofuji on Mar. 25, 2005, entitled, "ACTIVE DEVICES AND METHODS FOR MAKING THE SAME".

The U.S. Government has a paid-up license in this invention and the right in limited circumstances to require the patent owner to license others on reasonable terms as provided for by the terms of ATP cooperative agreement number 70NANB2H3032 awarded by NIST. The U.S. Government accordingly has rights in this invention.

FIELD OF THE INVENTION

The present invention relates to the field of active organic electronic devices and to methods for making such devices.

BACKGROUND OF THE INVENTION

Organic electronics is an emerging field of technology which aims to realize low-cost and environmentally-friendly fabrication of electronic devices. This field has drawn many researchers' interest both from academia and industry, and has seen a remarkable evolution in the past few years. See, for example: Forrest, S. R., "The path to ubiquitous and low-cost organic electronic appliances on plastic", Nature, vol. 428, pp. 911-918 (2004); and Katz, H. E., "Recent Advances in Semiconductor Performance and Printing Processes for Organic Transistor-Based Electronics", Chem. Mater., Vol. 16, pp. 4748-4756 (2004); the entirety of each of which is hereby incorporated herein by reference.

Organic field effect transistors ("FETs"), for example, are potential alternatives to amorphous silicon transistors, and are useful for instance in relatively low-speed devices such as pixel drivers of active matrix displays and radio frequency identification. Background information is provided in: Gelnick G. H. et al., "Flexible active-matrix displays and shift registers based on solution-processed organic transistors", Nature Mater., Vol. 3, pp. 106-110 (2004); and Kelley, T. W. et al., "Recent progress in organic electronics: Materials, devices, and processes", Chem. Mater., Vol. 16, pp. 4412-4422 (2004), the entirety of each of which is hereby incorporated herein by reference.

Potential advantages to making organic FETs instead of silicon- or other inorganic-based transistors include the possibilities of large-area and low-temperature fabrication, which may help enable fabrication of electronics such as display drivers on flexible plastic substrates. Polymers such as poly(alkylthiophene), and small organic molecules such as pentacene, can potentially be used as the semiconductor in these devices.

Patterning of various active device components, such as electrodes, dielectrics and semiconductors, is one of the key desirable fabrication capabilities in forming useful circuits from organic FETs. For example, pixel driver FETs in a backlit matrix display could benefit from higher current dynamic range (on/off ratio), lower crosstalk among pixels, and higher transparency, as a result of patterned semiconductor films. Background information is provided in Kymissis, I., Dimitrakopoulos, C. D., and Purushothaman, S., "Patterning pentacene organic thin film transistors", J. Vac. Sci. Technol. B, vol. 20, pp. 956-959 (2002), the entirety of which is hereby incorporated herein by reference.

Much work has been done to develop processes suitable for the fabrication of active electronic devices using organic semiconductors and dielectric materials. In one approach, an organic semiconductor was deposited onto an interlayer, and the resulting laminate of the semiconductor and interlayer was then transferred onto a receiving substrate, sandwiching the semiconductor as the middle layer. This approach did not enable the subsequent exposure of the semiconductor interface formed with the interlayer, which is desirable in some instances. In another approach, a semiconductor was deposited onto a release surface which then generated an explosive gas release to push the semiconductor onto a receiving substrate.

There accordingly is a continuing need for processes to enable the fabrication of active electronic devices comprising an organic semiconductor having an interface with an organic dielectric material.

SUMMARY OF THE INVENTION

In one embodiment, a process is provided for disposing an organic semiconductor film on a receiver substrate, comprising the steps of: depositing an organic semiconductor film onto a donor substrate, said semiconductor film having a first surface facing said donor substrate and having an exposed second surface; bringing the exposed second surface adjacent a receiver substrate such that the semiconductor film is in contact with both substrates; and then, moving the donor and receiver substrates apart; and wherein a surface portion of the receiver substrate is maintained above its glass transition during the moving step. In another embodiment, an active organic semiconductor device made by the process is provided.

In a further embodiment, an active organic semiconductor device is provided, comprising: a receiver substrate; and an organic semiconductor film on said receiver substrate, said semiconductor film having a smooth surface facing away from said receiver substrate; said receiver substrate having a glass transition occurring at a temperature within a range of between about 280° and about 300° Kelvin.

A more complete understanding of the present invention, as well as other features and advantages of the invention, will be apparent from the following detailed description and the accompanying drawings.

DETAILED DESCRIPTION

Figure 1:
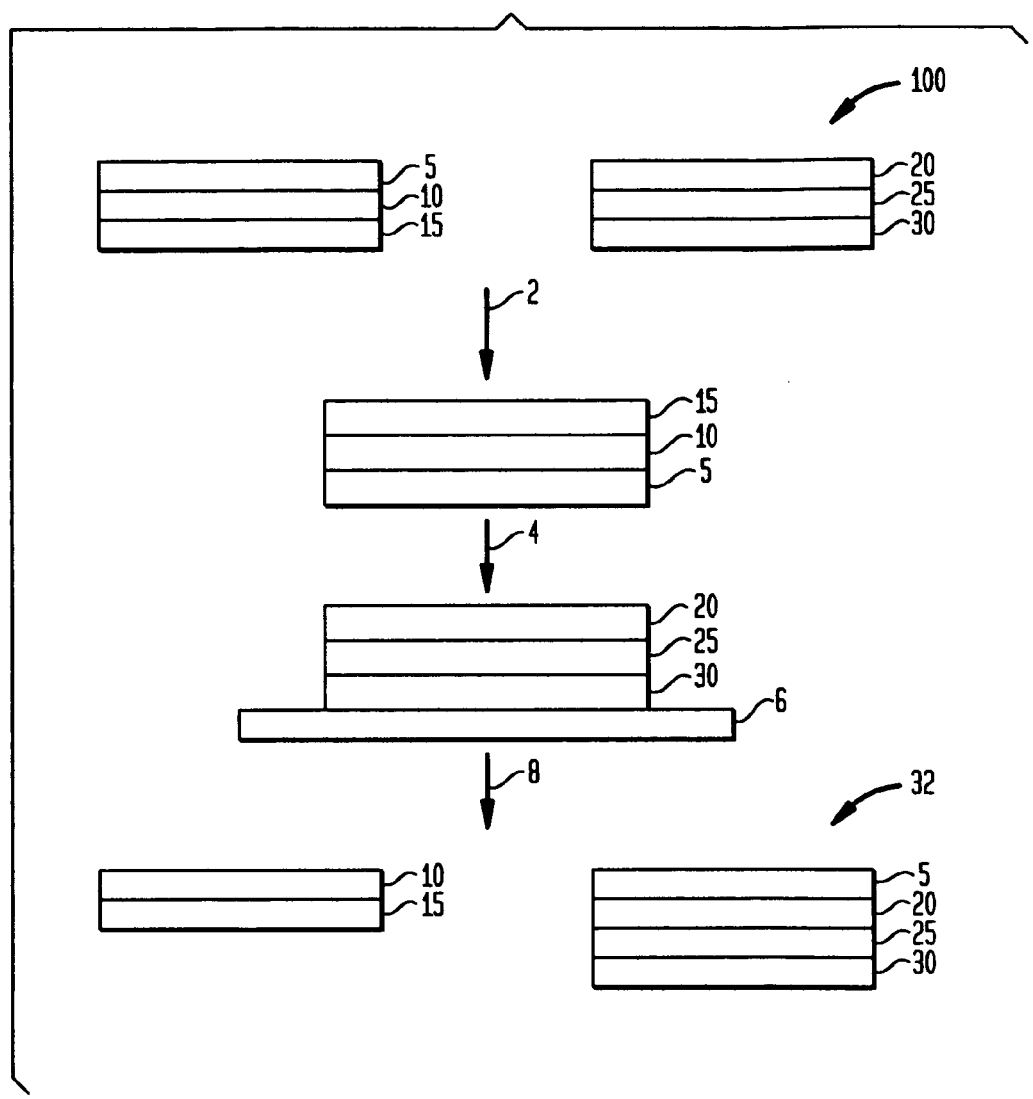
FIG. 1 shows cross-sectional schematic side views of elements as employed and processed in an embodiment of a semiconductor film hot melt transfer process for making devices.

In accordance with various embodiments, organic field-effect transistors (FETs) are provided as alternatives to amorphous-silicon and other amorphous-inorganic transistors; and other active organic semiconductor devices are provided as alternatives to their silicon- and inorganic-based analogs. Vacuum-deposited polycrystalline organic semiconductor films transferred from a donor to a receiver according to various process embodiments can exhibit charge carrier mobility similar to that of amorphous silicon, and can outperform amorphous organic semiconductors. Although some organic polymers can in general be deposited by inkjet printing or by dry transfer methods, the efficient transfer deposition of vacuum-deposited crystalline organic semiconductor films onto a receiver substrate to form active organic semiconductor devices having adequate performance capabilities including but not limited to charge carrier mobility, is difficult.

The term "film" as used throughout this specification is defined as a layer of the subject material as applied over an adjoining surface, however such layer is formed. A "film" may have a non-uniform thickness, does not have to be completely continuous, and may be the result of any desired deposition process undertaken in one or more than one steps. Hence, a "film" may also comprise one or more layers of the same material or different materials, which may or may not interpenetrate each other, and which layers together are referred to as the "film". There is no particular limitation on the thickness of a film, although films desirably have a thickness that is optimized for their intended function.

The term "substrate" as used throughout this specification is defined as a body of the subject material. A "substrate" may have a non-uniform thickness, does not have to be completely continuous, and may be the result of any desired formation process undertaken in one or more than one steps. Hence, a "substrate" may for example comprise one or more bodies of the same material or different materials, which may or may not interpenetrate each other, and which bodies together are referred to as the "substrate". There is no particular limitation on the thickness of a substrate, although substrates desirably have a thickness that is optimized for their intended function.

In one embodiment, a method is provided for transferring thin crystalline semiconductor films, featuring a receiver substrate that captures the semiconductor films from a donor substrate, and which receiver can also act as a gate insulator. The receiver substrate can be, for example, a thermoplastic polymer. The semiconductor compound 5,5'-bis(4-isopropylphenyl)-2,2'-bithiophene (hereinafter "diPr-PTTP") has, for example, been shown to have favorable solid state properties for this method. The x-ray structure of diPr-PTTP has been determined, and its performance and those of pentacene and copper phthalocyanine have been evaluated. Charge carrier mobilities of greater than 0.001 centimeters squared per volt-second ($cm^2/Vs$), as well as mobilities of greater than 0.01 $cm^2/Vs$, and on/off ratios approaching 10,000 have been obtained from thus transferred films. The diPr-PTTP in such trials retained mobility, after hot melt transfer, of about one-third the value of the measured mobility in the same material having been vapor-deposited directly onto the receiver substrate. Despite this comparatively reduced mobility, the thus transferred semiconductor film exposes the surface previously formed at the interface between the semiconductor and the donor. Exposing that semiconductor surface provides desirable performance properties. Further embodiments provide the resulting transferred thin crystalline semiconductor films.

Trials on the hot melt transfer of crystalline thin organic semiconductor films for FET fabrication were carried out to determine the effective mobility of the exposed surface of the transferred semiconductor films. The trials used as the receiver substrate, poly(butylmethacrylate) (PBMA). PBMA exhibits a relatively low surface energy, and undergoes drastic changes in mechanical properties above a certain threshold temperature. PBMA is also suitable for use as a gate dielectric in an FET. Although much of the following discussion will address FET fabrication using PBMA as the receiver substrate, other suitable receiver surfaces can be used, and other types of active electronic devices can be made.

Surface energy is an indication of the polarity of molecules on the semiconductor film surface and those on the juxtaposed surface of the donor or receiver substrate. The higher the surface energy at this interface, the more readily a polar liquid can wet the surface. Surface energy of a semiconductor, receiver polymer, donor polymer, or an interface between them is expressed in dynes/square centimeter. In one embodiment, the receiver substrate has an average thickness of about 0.6 micrometer ("µ"), in order to ultimately serve as an effective gate dielectric in an FET.

In one embodiment, a receiver substrate, a donor substrate and a slab of glass (1 mm thick, for more evenly applied pressure) were successively stacked in the listed order on a hotplate (100-120° C.). An oven or other alternative heating system may be substituted for the hotplate. Pressure was applied (1.4 kilograms per square centimeter ($kg/cm^2$) for 30 seconds, followed by 8 $kg/cm^2$ for 5 seconds) using a brass rod tipped with rubber sheet (having a surface area of about 0.5 $cm^2$). The substrates were removed immediately from the hotplate onto a tabletop to quench, and then were mechanically pulled apart. The transfer area was strongly dependent on the temperature of the hotplate. There was typically a threshold temperature below which the transfer hardly occurred at all. Gold was then vacuum deposited through a shadow mask which defined FET channel width ("W") and length ("L"): W=between about 2.5 millimeters (mm) and about 5 mm; and L=about 200 micrometers (µ). FET characteristics were measured with tungsten probes and a Hewlett-Packard ("HP") 4155B semiconductor parameter analyzer. In one embodiment, suitable pressures to be applied are within a range of between about 0.1 $kg/cm^2$ and about 100 $kg/cm^2$. In another embodiment, suitable pressures to be applied are within a range of between about 1 $kg/cm^2$ and about 10 $kg/cm^2$. Pressure is desirably applied in bringing the donor and receiver substrates together. The application of pressure in this manner can remove air voids from the interface between the semiconductor film and the receiver substrate, and can also flatten surface roughness of the film and substrate to improve contact between them. However, in the case of PBMA as the receiver substrate, for example, spontaneous wetting of the semiconductor film by the PBMA may occur without the application of external pressure. This spontaneous wetting is particularly likely to occur where the receiver substrate is sufficiently flat, which can be accomplished by careful spincasting of PBMA in an environment with dust control. For example, in an exemplary trial employing carefully spincast PBMA as receiver substrate and pentacene as the semiconductor film, joining the film and substrate together on a hotplate heated at 120° C. resulted in spontaneous wetting of pentacene by PBMA. No external pressure was applied, except for the weight of the donor substrate constituted by a microcover slip.

In one embodiment, a receiver substrate, a donor substrate and a slab of glass were successively stacked in the listed order on a hotplate set at a temperature within a range of between about 50° centigrade (C) and about 200° C. In another embodiment, a receiver substrate, a donor substrate and a slab of glass were successively stacked in the listed order on a hotplate set at a temperature within a range of between about 50° centigrade and about 150° C. In another embodiment, a receiver substrate, a donor substrate and a slab of glass were successively stacked in the listed order on a hotplate set at a temperature within a range of between about 70° C. and about 110° C. In a further embodiment, a receiver substrate, a donor substrate and a slab of glass were successively stacked in the listed order on a hotplate set at a temperature of about 100° C. Many of the polymers suitable for use as the donor substrate, onto which the semiconductor film is evaporated, have glass transitions (Tg) at temperatures on the order of 110° C., which is about 383° Kelvin. Desirably, the semiconductor film is transferred onto the receiver substrate at a temperature below the glass transition of the donor substrate. The temperatures at which such glass transitions occur depends on the particular heating profile and conditions employed. In the case of hotplate temperatures below the glass transition of the donor substrate, the heat application may be continued for an extended time such as, for example, about 5 minutes. Degradation of the selected semiconductor by overheating desirably is avoided.

FIG. 1 shows cross-sectional schematic side views 100 of elements as employed and processed in a series of steps in an embodiment of a semiconductor film hot melt transfer process for making devices. Referring further to FIG. 1, an organic semiconductor film 5 overlays a donor substrate 10 that itself overlays a glass support 15. The glass support 15 serves as a support for the donor substrate 10 and the semiconductor film 5. Meanwhile, a receiver substrate 20 overlays an indium tin oxide film 25 itself overlaying a glass support 30. The glass support 30 serves as a support for the indium tin oxide film 25 and the receiver substrate 20. By "glass" support is meant a substantially amorphous solid material, such as silicon dioxide with or without addition of other constituents for example.

Small molecule organic semiconductors were vacuum deposited on donor substrates 10 to make semiconductor transfer films 5. In one embodiment, the average thickness of the semiconductor film 5 is within a range of between about 10 nm and about 100 nm. In another embodiment, the average thickness of the semiconductor film 5 is within a range of between about 20 nm and about 50 nm. Thicker semiconductor films 5 are generally unnecessary and therefore are wasteful of materials. If the average thickness of the semiconductor film 5 is increased to about 150 nm, for example, the off current of an FET made with such a film 5 may be undesirably high. In the case of an FET fabricated with such a thick semiconductor film 5 that has the source and drain on one side of the semiconductor film 5 and the gate on the other side, the transferred film 5 may have a relatively high charge carrier mobility as compared with a semiconductor film of the same thickness made by direct evaporation-deposition onto the receiver 20. However, the charge carrier mobility of an FET device made with such a thick semiconductor film 5 still tends to itself be unsatisfactorily low. Donor substrates 10 are formed from polymers that undergo glass transitions at higher temperatures (Tg) than does the receiver substrate 20. Thus, the donor substrates 10 are less tacky than the receiver substrates 20 during the transfers. Receiver substrates 20 were prepared by spin-casting PBMA on indium-tin-oxide ("ITO")/glass surfaces 25.

The stack comprising donor substrate 10 and the semiconductor transfer film 5 was then placed in contact with the receiver substrate 20 as shown by the arrows 2 and 4. The combined stack including supports 15 and 30, films 5 and 25, and substrates 10 and 20, was placed on a hotplate 6 and heated to a temperature of about 110° C. On heating, the contact between the receiver substrate 20 and the semiconductor 5 formed an interface, which spread to extend the degree of contact upon the application of moderate pressure. The laminate was then cooled down to room temperature. The donor and receiver substrates 10 and 20 were selected to have relative glass transitions at different temperatures so that the semiconductor transfer film 5 adhered more strongly to the receiver substrate 20 than to the donor substrate 10. In particular, the glass transition properties of the substrates 10 and 20 were selected so that at least a surface portion of the donor substrate 10 could be maintained in a glass state, and so that at least a surface portion of the receiver substrate 20 could be maintained in a melted state by appropriately choosing the heating temperature. The mismatch of melting temperatures of the substrates 10 and 20 enabled increasing the adhesion of the semiconductor film 5 to the receiver substrate 20 and reducing the adhesion of the semiconductor film 5 to the donor substrate 10 during the heating step. Then, when the two surfaces were pulled apart as indicated by the arrow 8, the semiconductor transfer film 5 was largely transferred onto the receiver substrate 20 to produce the device 32. This hot melt transfer process can be carried out for example in about 30 seconds or less.

While this discussion makes reference to ITO films 25 adhered to and underlying the receiver substrate 20, it is to be understood that any conductor that can be adhered to and underlie the receiver substrate 20 can likewise be used. Further, alternatives to spin coating of the PBMA such as dip coating and doctor blade application can be used. In fabricating an FET, the ITO film 25 ultimately serves as the gate electrode. In one embodiment, the ITO film 25 has a thickness within a range of between about 0.5 micron ($\mu$) and about 5$\mu$.

Figure 2:
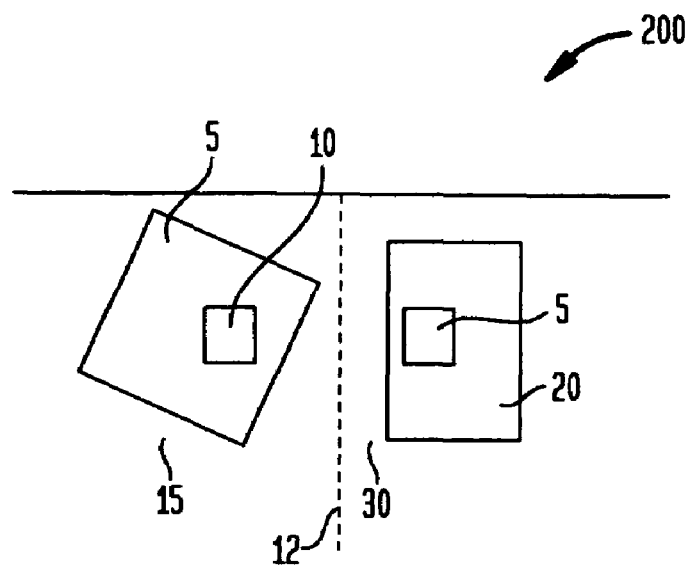
FIG. 2 shows the donor surface (left) and receiver surface (right) of elements employed in the hot melt transfer process of FIG. 1 after the semiconductor hot melt transfer process has been completed.

FIG. 2 shows a top view 200 of the same elements shown in side view in FIG. 1 for carrying out the semiconductor film hot melt transfer process. Wetting of the receiver substrate 20 and transfer of the semiconductor film 5 can be seen to have occurred only where pressure has been applied by a jig having square contact surface dimensions of about 7 millimeters ("mm") by 7 mm, resulting in an area-selective transfer having roughly those same dimensions. FIG. 2 thus shows the donor substrate 10 (left) and receiver substrate 20 (right), after the semiconductor transfer process discussed in connection with FIG. 1 has been completed. It can be seen as indicated by the dotted line 12 that the glass supports 15 and 30 have in this exemplary embodiment been constituted by a single glass support which was then folded onto itself to effect transfer of the semiconductor film 5.

In a further embodiment, a laser is directed to selectively heat the exposed surface of the donor substrate 10 located opposite to the semiconductor film 5, in order to selectively heat regions of the semiconductor film 5 and donor substrate 10 thereby causing a regioselective transfer of the semiconductor film 5 onto the receiver substrate 20. In an alternative embodiment, this heat can be applied through the receiver substrate 20 to reach the semiconductor film 5. In this manner, the laser writes the defined surface area of the desired semiconductor film 5 through the donor substrate 10 or receiver substrate 20.

In another embodiment, regioselective pressure is applied to the exposed surface of the donor substrate 10 or receiver substrate 20, such surface being opposite to surfaces of such substrates that face the semiconductor film 5. Laser induced heat is applied, similarly defining the surface area of the semiconductor film 5 to be transferred onto the receiver substrate 20. Other sources of selective heat application can also be used.

Heating conditions for the organic semiconductor transfer must be carefully chosen so that overheating does not occur. Otherwise, the semiconductor performance in the resulting devices can be compromised.

In another embodiment, the receiver substrate 20 is heated evenly on a hotplate and no means is provided for selection of areas of the semiconductor film 5 to be transferred.

Figure 3:
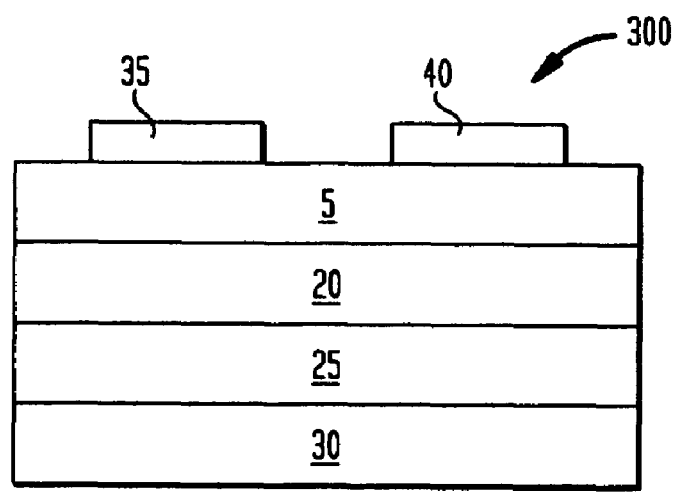
FIG. 3 is a cross-sectional view of a test FET device having gold source and drain electrodes on top of the transferred semiconductor film made according to the invention using the elements shown in FIGS. 1 and 2.

As shown in FIG. 3, test FET devices 300 were completed by vacuum deposition of gold source and drain electrodes 35 and 40 respectively, on top of the semiconductor film 5 transferred by the process of FIG. 1. The receiver substrate 20 and the ITO film 25 underneath the receiver substrate 20 serve as gate dielectric and gate electrode, respectively. Electrodes can alternatively be formed from platinum, palladium, silver, copper, nickel, or other charge-carrier conductive elements and alloys comprising them.

Figure 4:
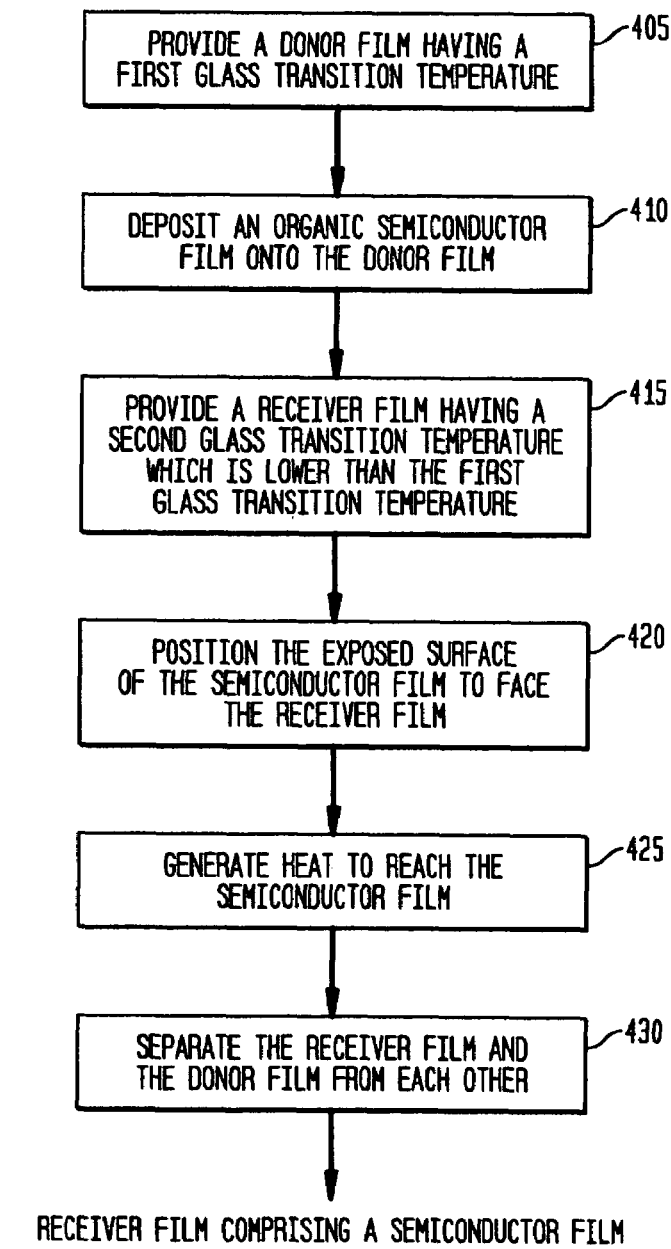
FIG. 4 shows an embodiment of a hot melt transfer process.

FIG. 4 shows a hot melt transfer process 400 for use with elements discussed above in connection with FIGS. 1-3. In step 405, a donor substrate 10 having a first selected glass transition is provided. In step 410, an organic semiconductor film 5 is deposited by any suitable process, e.g., vapor deposition, onto the donor substrate 10. In step 415, a receiver substrate 20 is provided, having a second selected glass transition, which occurs at a lower temperature under the heating profile employed than does the first selected glass transition. In step 420, the exposed surface of the semiconductor film 5 is positioned to face the receiver substrate 20 as shown by arrow 2 in FIG. 1, and these surfaces are positioned in mutual contact as shown by arrow 4 in FIG. 1. In step 425, heat is generated to reach the semiconductor film 5. For example, the heat may be generated by the hotplate 6 as shown in FIG. 1. In step 430, the receiver substrate 20 and the donor substrate 10 are separated from each other, as shown by arrow 8 in FIG. 1, thereby producing the stacked structure 32 shown in FIG. 1.

Three exemplary semiconductors were employed in the transfer semiconductor films: pentacene, copper phthalocyanine (CuPc) and a thiophene/phenylene co-oligomer, 5,5'-bis(4-isopropylphenyl)-2,2'-bithiophene (diPr-PTTP). The co-oligomer can be readily synthesized by a route similar to that used for the dihexyl-capped analogue, 6PTTP6. Information for said synthesis is available in Mushrush, M., Facchetti, A., Lefenfeld, M., Katz, H. E., and Marks T. J., "Easily processable phenylene-thiophene-based organic field-effect transistors and solution-fabricated nonvolatile transistor memory elements", *J. Am. Chem. Soc.*, vol. 125, pp. 9414-9423 (2003), which is hereby incorporated herein by reference in its entirety. The low surface energy of the isopropyl groups that bound the layers of the molecular crystal of diPr-PTTP was anticipated to be advantageous in promoting clean semiconductor film transfer. Although other alkyl groups having between 1-12 carbon atoms could also confer low surface energies to organic semiconductors, the isopropyl groups were also expected to allow easier growth of single crystals for structural analysis.

Although this discussion has been directed to pentacene, CuPc and diPr-PTTP, other organic semiconductors can also be used. For example, a bithiophene such as 5,5'-bis-(4-ethylphenyl)2,2'-bithiophene or 5,5'-bis-(8-hexylfluorine-1-yl)2,2'-bithiophene can be employed as the semiconductor. In additional exemplary embodiments, a thiophene such as sexithiophene or a benzothiophene dimer is employed as the semiconductor. Further exemplary thiophene compounds that can be used include: 2,5-linked thiophene tetramers, pentamers, and hexamers, either unsubstituted or substituted at the terminal 5 positions with linear alkyl or alkoxyalkyl chains of about 4 to about 12 atoms in length; anthradithiophene and terminal dialkyl derivatives thereof, including for example dihexylanthradithiophene; regioregular poly (3-hexylthiophene); and co-oligomers of 2,5-linked thiophene rings and 1,4-linked benzene rings about 5 rings long, either unsubstituted or substituted as described for the thiophene oligomers, including for example 1,4-bis(5-(5-hexylthien-2-yl)thien-2-yl)benzene (DHT4Ph). DHT4Ph can, e.g., be synthesized according to procedures described for hexylated 5- and 6-ring compounds in W. Li et al., Chem. Mater., Vol. 11, pp. 458 et seq. (1999), using 1,4-diiodobenzene as the source of the benzene ring. Other substituted and unsubstituted acenes such as tetracene and hexacene for example, substituted pentacenes, other bithiophenes, other thiophenes, phthalocyanines including for example copper phthalocyanine and perfluorinated copper phthalocyanine, naphthalene-1,4,5,8-tetracarboxylic diimide compounds, naphthalene-1,4,5,8-tetracarboxylic dianhydride, and 11,11,12,12-tetracyanonaphtho-2,6-quinodimethane, for example, can also be used. It is to be understood that the foregoing classes and species of semiconductors can be used, if available, in monomeric, oligomeric, and polymeric forms. See, for example, Dimitrakopoulos et al. U.S. Pat. No. 5,981,970; Bauntech, et al. U.S. Pat. No. 5,625,199; Garnier, et al. U.S. Pat. No. 5,347,144; and Klauck, Hagen et al., "Deposition: Pentacene organic thin-film transistors and IC's," *Solid State Technology*, Vol. 43, Issue 3, Mar. 2, 2000, pp. 63-75. The entirety of the foregoing patents and article are hereby incorporated herein by reference. Other organic compounds that are capable of transporting charge carriers when formed into a film can also be used. However, polymeric semiconductors tend to have lower charge carrier mobility than small organic molecules and tend to be unstable when exposed to oxygen and water. Although small organic molecules may be more attractive in favor of their higher charge carrier mobility, on/off ratios, and chemical stability, polymers generally more easily form continuous films from liquid phase deposition. Here, "small organic molecules" means molecules having a well defined molecular weight, for example, a molecular weight of less than about 1,000 grams per Mole.

Synthesis of 5,5'-bis(4-isopropylphenyl)-2,2'-bithiophene (diPr-PTTP). A solution of 1.8 g of 5,5'-bis(tributylstannyl)-2,2'-bithiophene, 1.3 g of 1-bromo-4-isopropylbenzene, and 80 mg of $Pd(PPh_3)_4$ in 35 milliliters ("mL") of N,N-dimethylformamide was heated at 70° C. for 2 days under nitrogen. After cooling, 0.6 g of yellow-green solid was obtained after washing with methanol and ether, verified pure by nuclear magnetic resonance spectroscopy ("NMR"), and used directly for film and crystal studies.

Semiconductor diPr-PTTP single crystals were grown by a horizontal physical vapor transport in a stream of argon gas using a procedure disclosed in Laudise, R. A., Kloc, Ch., Simpkins, P. G., and Siegrist, T., "Physical vapor growth of organic semiconductors", *J. Cryst. Growth,* Vol. 187, pp. 449-454 (1998), the entirety of which is hereby incorporated herein by reference. The evaporating material was heated to 240° C. in the hot zone of a two-zone furnace. The second zone was held at room temperature. The diPr-PTTP single crystals spontaneously grew on a glass tube wall between the two zones. The crystal structure of these needles was investigated using an Oxford-Diffraction Xcalibur-2 diffractometer using a triple-axis custom 4-circle diffractometer with copper radiation. Crystallographic data was deposited with the Cambridge Crystallographic Data Centre, CCDC 259208.

Figure 5:
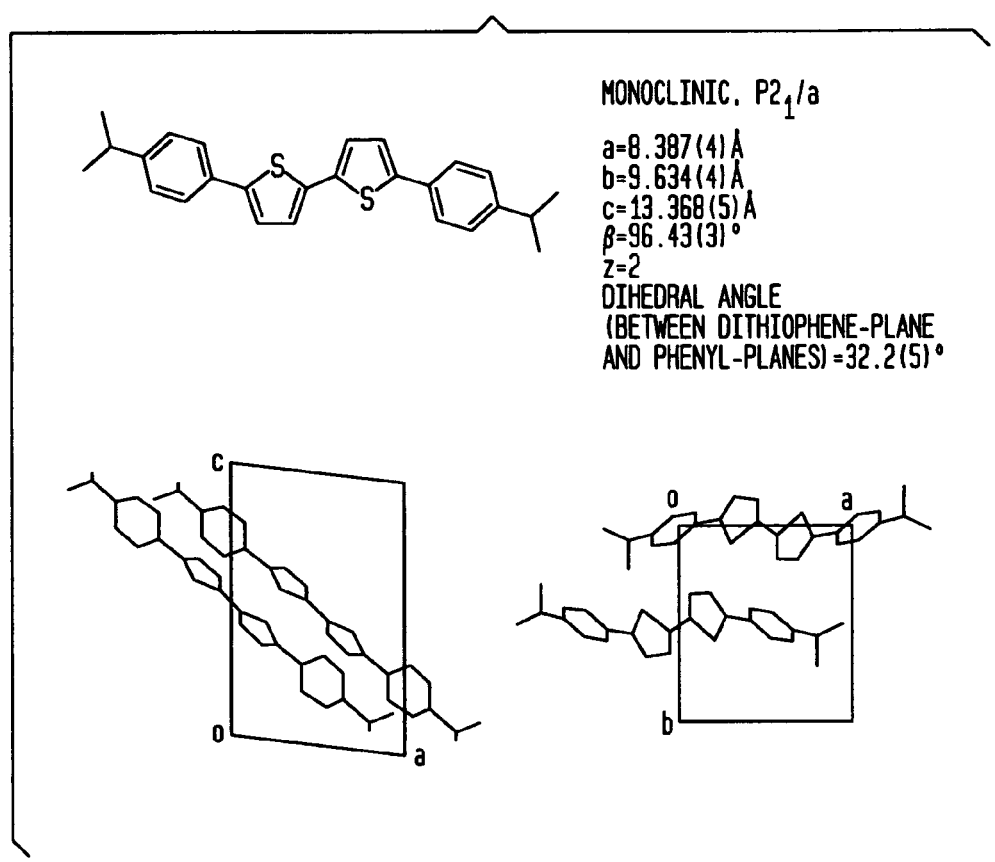
FIG. 5 shows the molecular and crystal structure of diPr-PTTP.

A crystal structure of diPr-PTTP is illustrated in FIG. 5. The top figure shows the chemical structure of and crystallographic data for diPr-PTTP. The crystal structure is monoclinic, $P2_{1/a}$; a=8.387(4) angstroms ("Å"); b=9.634(4) Å; c=13.368(5) Å; β=96.43(3)°; Z=2; and the dihedral angle (between the dithiophene-plane and phenyl-planes)= 32.2(5)°. The bottom left and right figures show the diPr-PTTP crystal structure as viewed along the b-(left figure) and c-(right figure) crystal axes, respectively. Hydrogen atoms are omitted from the structures. Two phenylenes are tilted in the same sense by 32.2° with respect to the central dithiophene plane. The edge-to-face intermolecular interactions are sufficient to support hole transport, and the crystal (film) faces are rich in low-surface energy—generating methyl groups.

Figure 6:
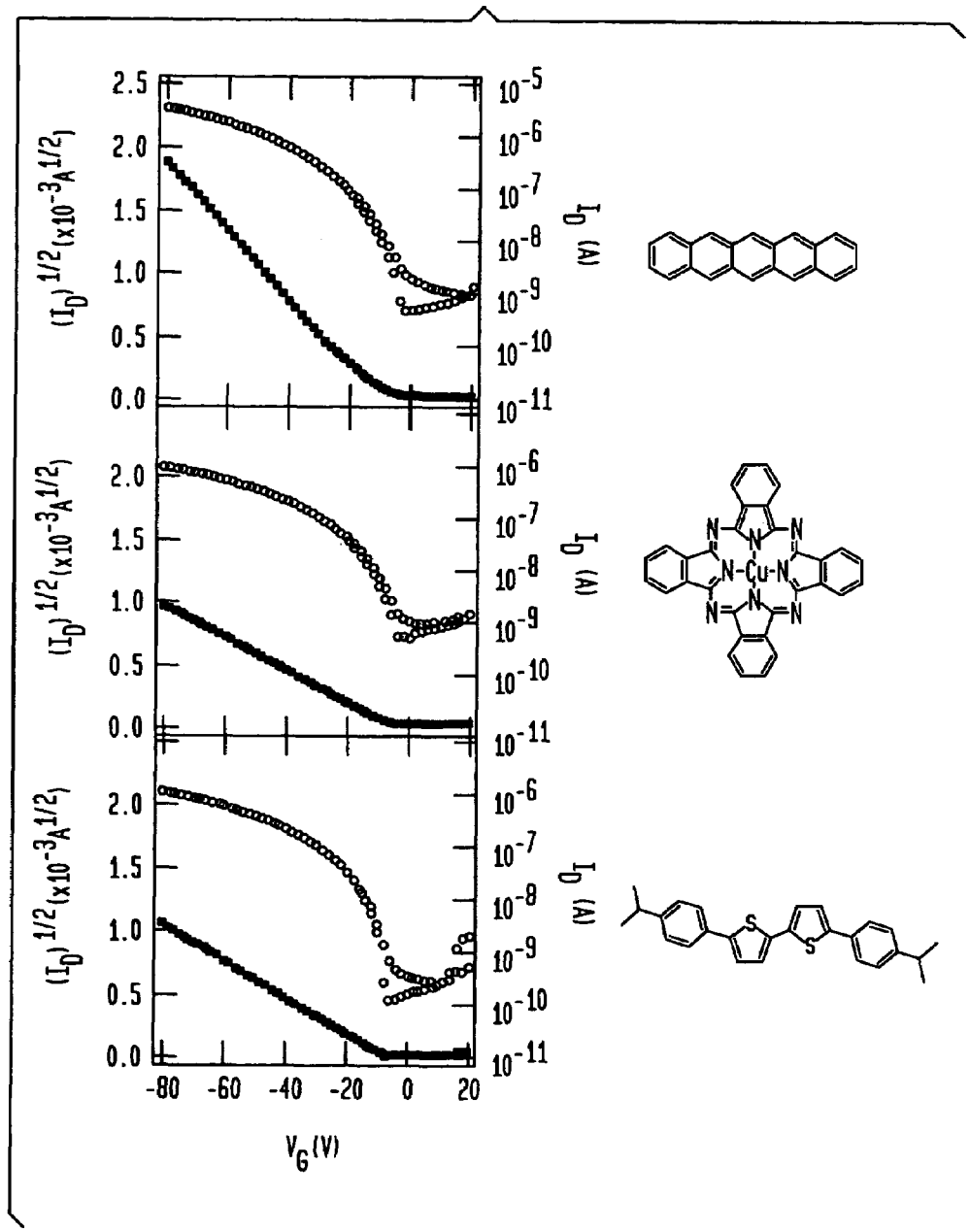
FIG. 6 shows transfer characteristics of FETs with laminated pentacene, CuPc and diPr-PTTP channels.

Exemplary transferred semiconductor films showed clear FET activity. Transfer characteristics of FETs using laminated pentacene, CuPc and diPr-PTTP are shown in FIG. 6. The top figure shows hot melt transfer characteristics of laminated FETs in which the semiconductor is pentacene and the donor substrate is poly(4-methylstyrene) ("4M"). The center figure shows hot melt transfer characteristics of laminated FETs in which the semiconductor is CuPc and the donor substrate is glass, vacuum deposited at 150° C. The bottom figure shows hot melt transfer characteristics of laminated FETs in which the semiconductor is diPr-PTTP and the donor substrate is poly(trifluoroethylmethacrylate) ("TF"). In all three cases, drain voltage ("$V_D$")=−100 volts ("V"), assuring that the FETs are in saturation regime throughout the gate voltage ("$V_G$") sweep range. "$I_D$" means drain current, in amperes ("A"). Chemical structures of the respective semiconductors are also shown; hydrogen atoms are again omitted.

On/off ratios ranged from $10^3$-$10^4$ depending on the semiconductor employed. These on/off ratios could be further improved, because the gold electrode arrays used in these trials were smaller than the transferred area of semiconductor films. Thus, the devices were not fully isolated.

FETs were made with pentacene films transferred from various different donor substrates, and their performance was compared. Besides the as-cleaned glass surface, three different polymers were employed as donor substrates: poly (trifluoroethylmethacrylate) ("TF"), poly(cyclohexylmethacrylate) ("CH") and poly(4-methylstyrene) ("4M"). In preliminary trials, glass surfaces treated with silanes such as octadecyltrichlorosilane were also used as donor substrates, but the pentacene films transferred from them did not show any FET action. Transferred pentacene films showed a higher charge carrier mobility when they were hot melt transfer laminated from a 4M donor substrate (mobility=µ=2.4×$10^2$ cm²/Vs) rather than from donor substrates such as glass, CH or TF.

These results were consistent with x-ray diffraction ("XRD") results on as-deposited pentacene films on different donor substrates. According to such XRD results, 4M samples showed 40% stronger (001) crystal plane reflection intensity than TF and CH counterparts indicating an improved (001) crystal plane texture smoothness in the film. However, charge carrier mobilities in the transferred semiconductor films were one order of magnitude less than those in control FETs, whose pentacene films were directly vacuum deposited onto receiver substrates (µ=0.29 cm²/Vs).

TF was synthesized by polymerizing 16 grams (g) of inhibitor-free 2,2,2-trifluoroethyl methacrylate with 0.1 g of azobis(isobutyronitrile) initiator in 50 milliliters ("ml") of acetone heated nearly to reflux under nitrogen, adding the initiator as a solution in 10 mL of acetone over 3 hours ("h"), heating 3 additional hours, and precipitating into 300 mL of 50% aqueous methanol.

TF, 4M (Aldrich) and CH (Aldrich) were spin-coated from 5-10 wt % solutions in cyclopentanone (Aldrich, HPLC grade) on reactive ion etching ("RIE")-cleaned microscope cover glass slides (VWR International, #2), then baked at 150° C. for more than 12 hours ("hrs"). Prior to carrying out RIE, the cover glass slides were washed successively in water and acetone, ultrasonicated, and then dried. As-cleaned slides were used as the glass donor substrates. Following the spin coating, the slides were baked dry and then protected against dust particle contamination. In one embodiment, the donor substrate has a surface energy within a range of between about 10 dynes/square centimeter and about 30 dynes/square centimeter. In another embodiment, the donor substrate has a surface energy within a range of between about 10 dynes/square centimeter and about 20 dynes/square centimeter.

Organic semiconductors including pentacene (Aldrich, as-received), CuPc (Aldrich, 3 times sublimed), and diPr-PTTP (as-synthesized) were then vacuum deposited under a background pressure of less than about 5×$10^{-6}$ Torr. The target semiconductor film thickness and deposition speed (50 nm and 1.5 Angstroms per second ("Å/s"), respectively) were monitored with a crystal thickness monitor. Other methods for evaporation of an organic semiconductor onto the donor substrate, if available, can be used.

Although this discussion has been directed to embodiments in which the donor substrate surface, on which a semiconductor is deposited, is formed from TF, 4M or CH, other polymers can also be used. For example substituted and unsubstituted dimethylsiloxane-based polymers can be used. Criteria for selecting other polymers include their: suitability as release surface materials; low surface energy; and adhesion that becomes reduced at an elevated temperature.

Glass receiver substrates were fabricated using cover glass slides prepared in the same manner as earlier discussed, which were then provided with an ITO coating. Poly(butylmethacrylate) (Aldrich) was spin-coated at a speed of 3000 revolutions per minute ("rpm") for 45 seconds, from a 10% cyclopentanone solution on the ITO-coated glass and baked at 150° C. for more than 12 hours, yielding 0.6 micron-thick substrates, having a typical capacitance of Ci=about 4.9 nanofarads per square centimeter ("nF/cm²"). High relative humidity was found to be detrimental to the clarity and performance of the resulting PBMA substrates. Accordingly, the ambient humidity is desirably reduced during the spin coating. Desirably, the relative humidity is reduced to below about 60% during the spin coating and subsequent drying of the PBMA substrate.

Although this discussion has been directed to embodiments in which the receiver substrate surface, onto which the semiconductor is hot melt transferred from a donor substrate, is formed from PBMA, other polymers can also be used. Properties of PBMA that are desirable for making receiver substrates include its glass transition occurring for example at a temperature (Tg) of about 293° Kelvin ("K") which is near room temperature, and its moderate polarity and surface energy. Further, polymers having adhesion that increases at elevated temperatures are desirable. Given a Tg of about 293° K, PBMA undergoes a large change in thermal properties with mild heating. Other polymers that can be used include, for example, acrylates and methacrylates (exemplary Tg of about 300° K), polymethylacrylate (exemplary Tg of about 283° K), and 3-oxabutylmethacrylate (exemplary Tg of about 289° K; also referred to as polymethoxyethylmethacrylate).

The glass transistions of the donor and receiver substrates are deliberately mismatched in temperature to improve the semiconductor hot melt transfer process. In this regard, desirably the temperature at which the semiconductor film is transferred affects the donor substrate by reducing its adhesion to the semiconductor, and affects the receiver substrate by increasing its adhesion to the semiconductor. For example, the donor substrate can be in a glassy state at the temperature of the hot melt transfer so that the semiconductor film is not wetted by nor strongly adhered to the donor substrate at the temperature of the hot melt transfer. At the same time, the glass transition of the receiver substrate can occur at a sufficiently low temperature so that the receiver substrate is melted at the same temperature. Then, the semiconductor is wetted by and strongly adhered to the receiver substrate during the hot melt transfer. Such a differential adhesion facilitates the hot melt transfer of the semiconductor film to the receiver substrate when the donor and receiver substrates are separated from each other at the hot melt transfer temperature. In another embodiment, the semiconductor film itself undergoes a melting transition, at a temperature above that of the transfer step, thus facilitating the release of the semiconductor from the donor. In one embodiment, the melting transition of the receiver substrate occurs at least about 20° Kelvin below that of the donor substrate. In another embodiment, the melting transition of the receiver substrate occurs at a temperature that is at least about 50° Kelvin below that of the donor substrate. In a further embodiment, the melting transition temperature of the receiver substrate is within a range of between about 280° Kelvin and about 300° Kelvin. In an additional embodiment, the melting transition temperature of the donor substrate is within a range of between about 370° Kelvin and about 385° Kelvin.

The influence of the donor substrate temperature during semiconductor growth on the performance of fabricated FETs was studied in trials on the fabrication of CuPc FETs. The density of grain boundaries in a vacuum deposited organic semiconductor film, and hence the carrier mobility in the film, can be controlled by controlling the donor substrate temperature during the deposition, e.g., as described in, A., "Organic field-effect transistors with high mobility based on copper phthalocyanine", by Bao, Z., Lovinger, A. J., and Dodabalapur, *Appl. Phys. Lett.,* Vol. 69, pp. 3066-3068 (1996), the entirety of which is hereby incorporated herein by reference. The FETs with laminated CuPc which had been grown on a glass donor substrate at room temperature demonstrated charge carrier mobilities of about $\mu=4.6\times10^{-4}$ cm$^2$/Vs. Upon increasing the CuPc growth temperature to about 150° C., the resulting mobility in the transfer-film FETs was enhanced by more than 8 times to mobilities of about $\mu=3.9\times10^{-3}$ cm$^2$/Vs. The grain size of the as-deposited CuPc also increases with the semiconductor growth temperature as observed by atomic force microscopy ("AFM"). For example, FETs with semiconductors grown at room temperature had mobilities of about $\mu=7.6\times10^{-3}$ cm$^2$/Vs and FETs with semiconductors grown at 150° C. had mobilities of about $\mu=3\times10^{-4}$ cm$^2$/Vs thereby showing that at 150° C. the surface of the receiver substrate was not stable enough to form a continuous CuPc film on it.

These comparative results imply that the hot melt transfer method can introduce some flexibility in fabrication of FETs. For example, a semiconductor growth condition such as high semiconductor growth temperature can be used for deposition on the donor substrate even though the condition is not compatible with other steps or with other materials which are to form part of the final FETs.

In some trials, diPr-PTTP films were transferred reproducibly from a TF donor substrate, while other donor substrates gave little or no transfer. In the latter cases the diPr-PTTP films were wetted by the receiver substrates but were hardly transferred at all onto the receiver substrates. In these trials, the very low surface energies at the interfaces between the semiconductors and the TF donor substrate promoted transfer of the entire film. The laminated diPr-PTTP films retained relatively high mobilities of about $\mu=4.5\times10^{-3}$ cm$^2$/Vs, compared to control FETs whose diPr-PTTP films were directly vacuum deposited onto receiver substrates and which had mobilities of about $\mu=1.4\times10^{-2}$ cm$^2$/Vs. In contrast, laminated pentacene and CuPc in other trials discussed earlier had mobilities of about one order of magnitude less than such control FETs.

Another feature of diPr-PTTP was that the laminated semiconductor films had sharp edges. These sharp edges are an indication of a relatively high potential to transfer diPr-PTTP from selected, patterned areas of a donor substrate onto a receiver substrate. Patterned transfer of the semiconductor is desirable, but is not required, as full flat semiconductor depositions do not greatly deteriorate FET performance.

Figure 7:
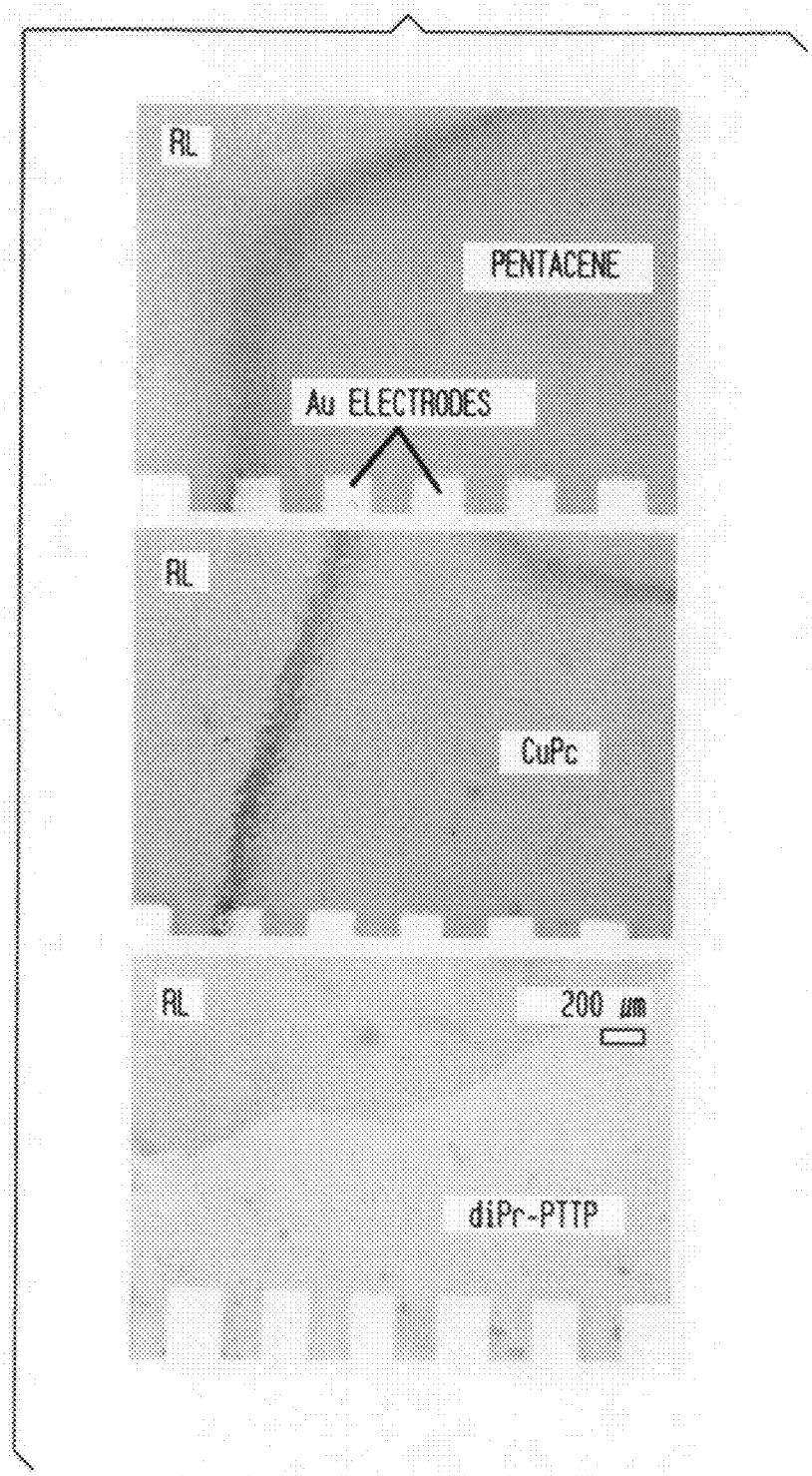
FIG. 7 shows micrographs of receiver substrates that captured three different semiconductor films.
Figure 8:
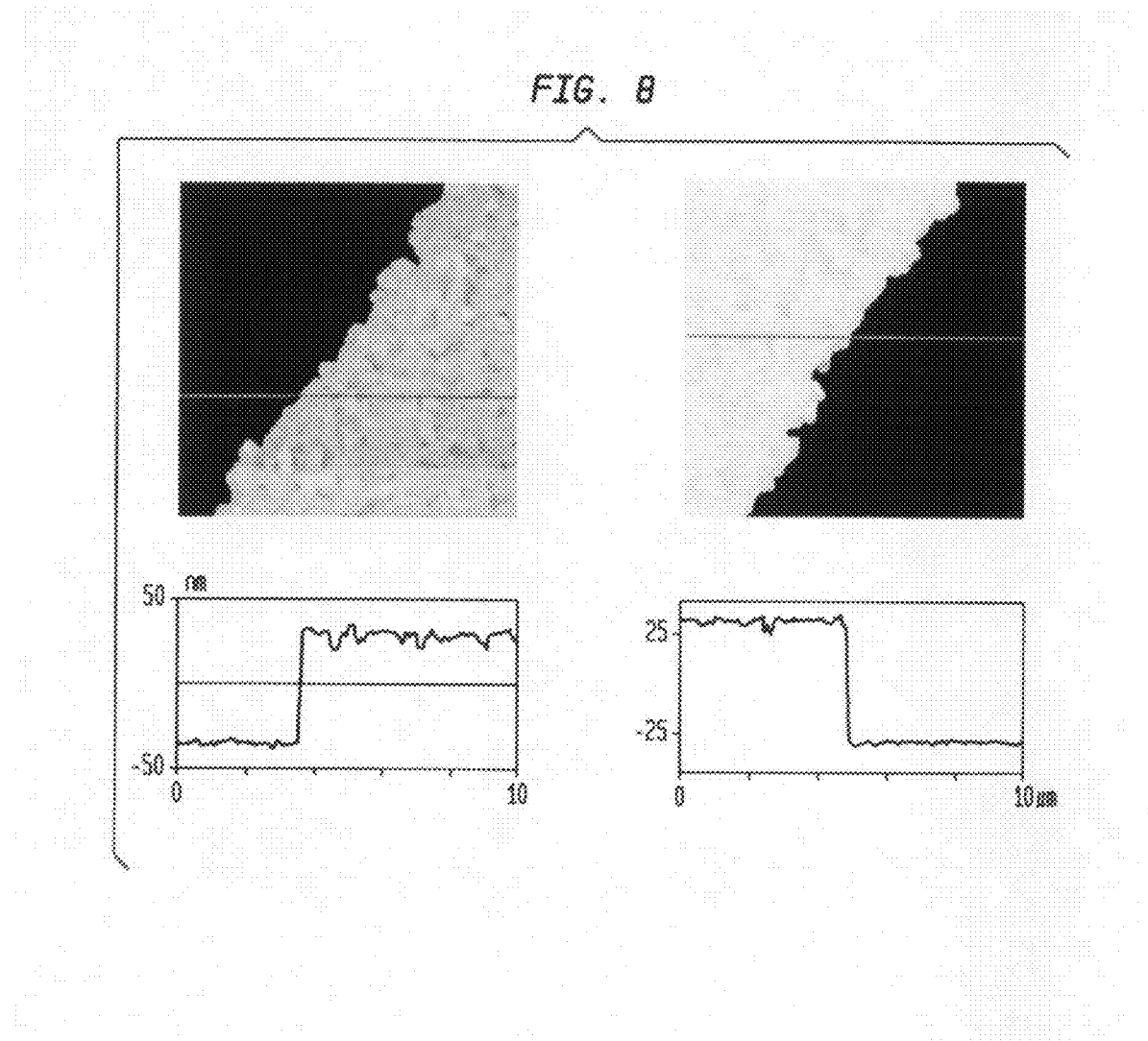
FIG. 8 shows atomic force microscopy images of transferred edges of diPr-PTTP on donor and receiver substrates.

FIG. 7 shows optical micrographs of the receiver substrates that captured three different semiconductor films. The designation "RL" indicates the PBMA receiver substrate; the other portion of each optical micrograph shows the semiconductor film. The top figure is an optical micrograph of the edge of a pentacene semiconductor film transferred onto a receiver substrate, deposited at ambient room temperature. The center figure is an optical micrograph of the edge of a CuPc semiconductor film transferred onto a receiver substrate, deposited at 150° C. The bottom figure is an optical micrograph of the edge of a diPr-PTTP semiconductor film transferred onto a receiver substrate, deposited at ambient room temperature. FIG. 8 shows 10×10 μm$^2$ AFM images including in the left image the transfer edge of diPr-PTTP on a TF donor substrate, and in the right image the transfer edge of diPr-PTTP transferred onto the receiver substrate. The dark regions represent the donor and receiver substrate. The edges were well defined even on a microscopic scale. The horizontal lines indicate the locations of measurement of the relative film height data displayed as cross-sections in the lower panels of FIG. 8.

Data from a series of trials, including those discussed above in connection with FIG. 7, are reported in Table 1 below.

TABLE 1

| Donor substrate vs. Semiconductor Trials | Pentacene | CuPc 150° C. | CuPc Room Temp | diPr-PTTP |
|---|---|---|---|---|
| Evaporated (control) | $3 \times 10^{-1}$ | PBMA was hazy | $8 \times 10^{-3}$ | $2 \times 10^{-2}$ |
| Transferred From Glass | $7 \times 10^{-3}$ | $* 4 \times 10^{-3}$ | $5 \times 10^{-4}$ | Minimal Transfer |
| Transferred From TF | $7 \times 10^{-3}$ | — | $5 \times 10^{-4}$ | $* 5 \times 10^{-3}$ |
| Transferred From 4 M | $* 3 \times 10^{-2}$ | — | $4 \times 10^{-4}$ | Minimal Transfer |
| Transferred From CH | $8 \times 10^{-3}$ | — | $5 \times 10^{-4}$ | No Transfer |

Table 1 reports the charge carrier mobilities of FETs fabricated under the indicated conditions. All mobility measurements were made using the testing procedures defined in Mushrush, M., Facchetti, A., Lefenfeld, M., Katz, H. E., and Marks T. J., "Easily processable phenylene-thiophene-based organic field-effect transistors and solution-fabricated non-volatile transistor memory elements", *J. Am. Chem. Soc.*, vol. 125, pp. 9414-9423 (2003). The first column indicates the donor substrate used, except in the control where the semiconductor was directly evaporated onto the receiver substrate. The first row headings indicate the semiconductor that was used. All transfers of semiconductors were carried out under pressure at room temperature except for two CuPc trials in which the donor substrate was heated to 150° C. CuPc trials at 150° C. with TF, 4M and CH were not done. Trials indicated by * are also shown in FIG. 7 and discussed above. When TF surfaces were used as donor substrates, all three semiconductors were successfully transferred. Pentacene and CuPc were also successfully transferred from glass, 4M and CH. However, diPr-PTTP was transferable only from TF. Heating the CuPc to 150° C. improved the resulting mobility by an order of magnitude. Comparing the evaporative controls to the transfer trials, the mobility dropped by about an order of magnitude for pentacene and CuPc, but not as much for diPr-PTTP.

Figure 9:
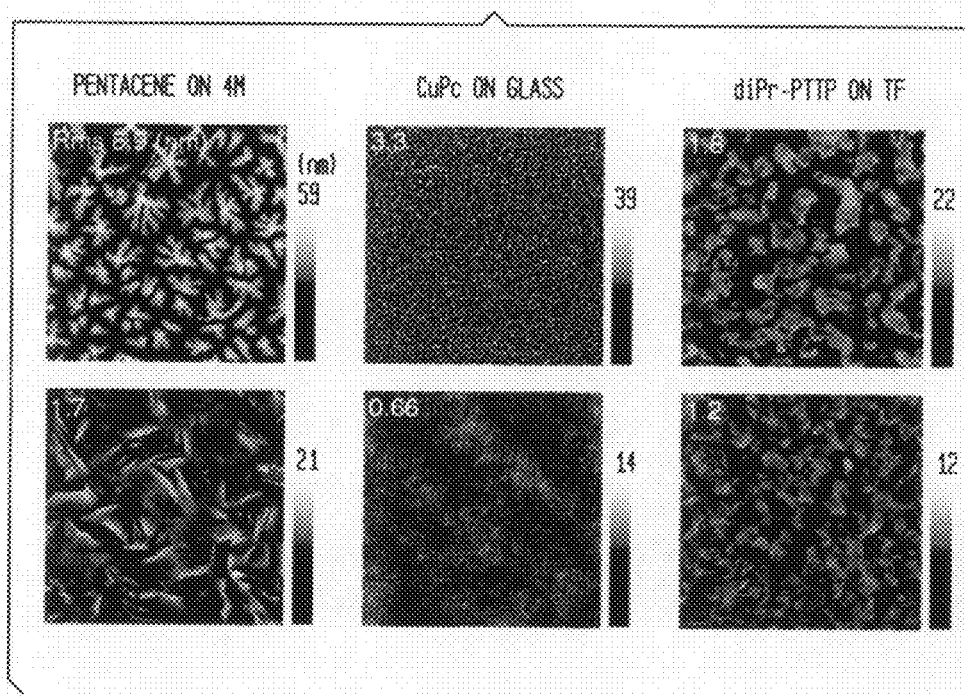
FIG. 9 shows atomic force microscopy images of three semiconductor films on donor substrates before hot melt transfer and on receiver substrates after transfer.

FIG. 9 shows 5×5 µm² AFM images of three semiconductor films both on the donor substrate before transfer, and on the receiver substrate after transfer. Root mean square roughness ("RMS") data are given for the surface of each film, in nanometers. The upper set of three images shows the exposed as-grown top, or "free" surface of the semiconductor film opposite to the film surface adjoining the donor substrate. The lower set of three images shows the semiconductor growth interface, originally adjoining the donor substrate, but now exposed following the hot melt transfer process as the new top surface of the film. The left pair of upper and lower images employed pentacene as the semiconductor and 4M as the donor substrate, with respective surface roughness values of 8.9 nm and 1.7 nm. The middle pair of upper and lower images employed CuPc as the semiconductor and glass as the donor substrate, with respective surface roughness values of 3.3 nm and 0.66 nm. The right pair of upper and lower images employed diPr-PTTP as the semiconductor and TF as the donor substrate, with respective surface roughness values of 1.8 nm and 1.2 nm. To the right of each 5×5 µm² AFM image in FIG. 9 is a vertical bar labeled with the average thickness of the respective semiconductor film shown in the image to its left, in nanometers. Pentacene and CuPc show growth interface profiles, after their transfer, which are similar to profiles that have been published elsewhere for as-deposited thin films. As to pentacene, exemplary published profiles are provided in Lin, Y.-Y., Gundlach, D. J., Nelson, S. F., and Jackson, T. N., "Pentacene-based organic thin-film transistors", *IEEE Trans. Elec. Dev.*, Vol. 44, pp. 1325-1331 (1997); Ruiz, R. et al., "Pentacene Thin Film Growth", *Chem. Mater.*, Vol. 16, pp. 4497-4508 (2004); and Kato, Y. et al., "High mobility of pentacene field-effect transistors with polyimide gate dielectric layers", *Appl. Phys. Lett.*, Vol. 84, pp. 3789-3791 (2004); the entirety of each of which is hereby incorporated herein by reference. As to CuPc, exemplary published profiles are provided in Bao, Z., Lovinger, A. J., and Dodabalapur, A., "Organic field-effect transistors with high mobility based on copper phthalocyanine", *Appl. Phys. Lett.*, Vol. 69, pp. 3066-3068 (1996); and Ofuji, M. et al., "Growth process of vacuum deposited copper phthalocyanine thin films on rubbing-treated substrates", *Jpn. J. Appl. Phys.*, Vol. 42, pp. 7520 et seq. (2003); the entirety of each of which is hereby incorporated herein by reference.

The pentacene and CuPc lower images show that the donor substrate/semiconductor interfaces, as exposed after hot melt transfer of the semiconductors to the receiver substrates, are flatter than are the as-grown top surfaces shown in the corresponding upper images. This observation is consistent with the fact that most organic and inorganic compounds deposited on a flat, inert substrate show two-dimensional growth along the substrate surface at the first stage of growth, followed by three-dimensional domain growth. Background information on this phenomenon is provided in Forrest, S. R., "Ultrathin organic films grown by organic molecular beam deposition and related techniques", *Chem. Rev.*, Vol. 97, pp. 1793-1896 (1997), the entirety of which is hereby incorporated herein by reference. Unlike the case of metals, charge carrier conduction through an organic field effect transistor semiconductor is overwhelmingly near the semiconductor interface. The topography of the semiconductor film surface in contact with an initial donor substrate on which the semiconductor film is made generally varies greatly from the topography of the opposite face of the film. Electronic properties accordingly differ between the two surfaces because of the topographic contrast. In the laminated FETs, the exposed top surfaces of the as-deposited semiconductor films become charge carrier conducting channels. When an organic FET is in accumulation mode, the carriers are strongly confined within that portion of the semiconductor domain that is within a few monomolecular layers of the interface with the dielectric. Background information regarding this confinement is provided in Dodabalapur, A., Torsi, L., and Katz, H. E., "Organic transistors: two-dimensional transport and improved electrical characteristics", *Science,* Vol. 268, pp. 270-271 (1995); Alam, M. A., Dodabalapur, A., and Pinto, M. R. A., "Two-dimensional simulation of organic transistors", *IEEE Trans. Elec. Dev.*, Vol. 44, pp. 1332-1337 (1997); and Horowitz, G. and Hajlaoui, M. E., "Mobility in polycrystalline oligothiophene field-effect transistors dependent on grain size", *Adv. Mater.*, Vol. 12, pp. 1046-1050 (2000), the entirety of each of which is hereby incorporated herein by reference. Therefore, a relatively rougher semiconductor/dielectric interface should generate more localized carrier traps and lead to poorer FET charge carrier mobility. Hence, vapor deposition of an organic semiconductor film onto a donor substrate, and then transfer of the semiconductor film to a receiver substrate, results in exposure of a semiconductor film surface that may have an advantageously low RMS roughness.

Referring to the pair of upper and lower images on the right-hand side of FIG. 9, trials in which diPr-PTTP was the semiconductor clearly show two-dimensional crystal growth, with a relatively flatter as-grown top surface in the upper image taken before semiconductor transfer than those of the other semiconductor films. The transferred film as shown in the lower image has similar topography. This topography may be the reason that the laminated diPr-PTTP FETs have higher retained mobilities relative to those in control FETs made by a process in which diPr-PTTP is directly deposited onto a receiver substrate.

Figure 10:
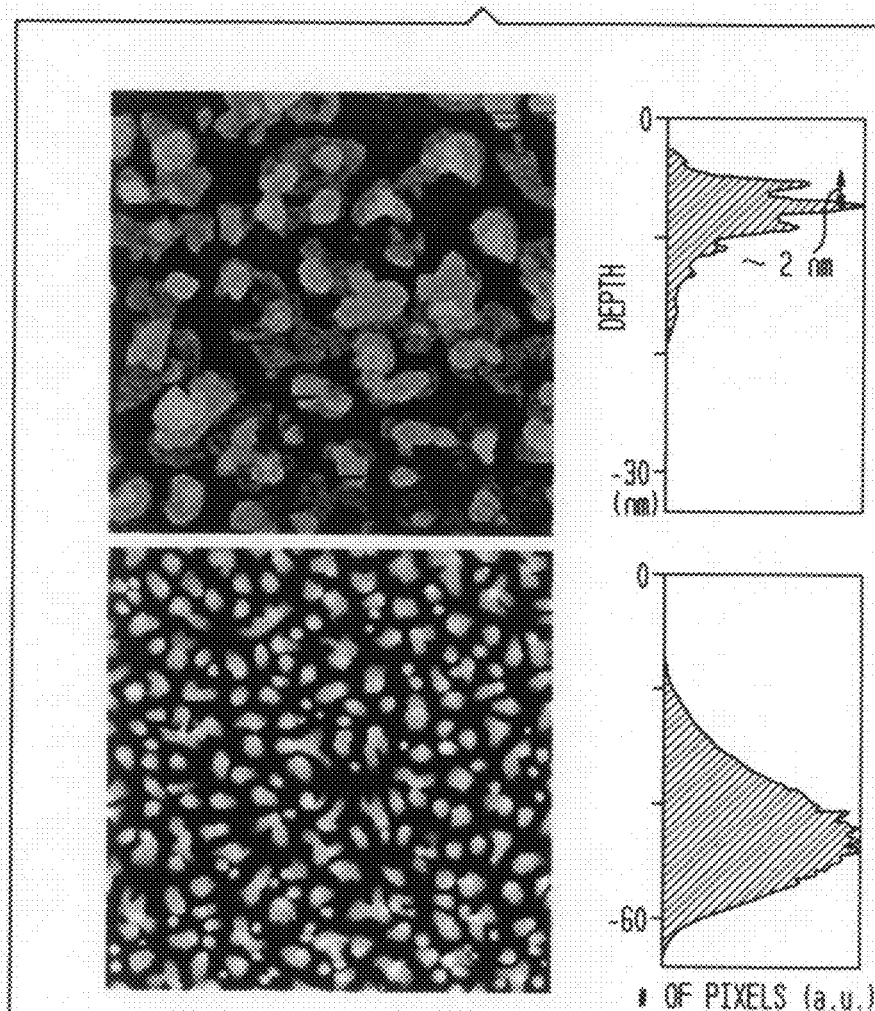
FIG. 10 shows atomic force microscopy images of diPr-PTTP and pentacene films, and height distribution histograms.

FIG. 10 shows a 5×5 µm² AFM image of a diPr-PTTP film vacuum deposited on a glass cover slide surface at the top left, and at the top right shows a histogram of the height distribution in arbitrary relative units ("a.u."), across the horizontal x-axis, of all pixels in the top left image measured from the highest pixel. FIG. 10 further shows a 5×5 µm² AFM image of a pentacene film vacuum deposited on a glass cover slide surface at the bottom left, and at the bottom right shows a histogram of the height distribution of all pixels in the bottom left image measured from the highest pixel. The top left image more clearly shows two-dimensional growth of diPr-PTTP in the film deposited on glass, which is an even flatter surface than used in the previous trials. The top right image shows two-dimensional layers equally spaced by about 2 nm, in close agreement with the corresponding thin film XRD pattern of this film sample, which shows sharp reflections with a d-spacing of 1.88 nm, observable up to $6^{th}$ order. However, this d-spacing cannot be explained from the single crystal structure, and therefore, the thin film must have crystallized in a different polymorphic form. All of the "fingers" in the height distribution lie within about 20 nm down from the surface, which is less than one third of the 70 nm film thickness as determined by FIG. 8. This result suggests that the film is composed of domains which are highly interconnected laterally with other domains. By contrast, the lower right panel of FIG. 10 shows that in the case of pentacene films, most of the film volume lies close to the substrate, with significant penetration of the AFM needle through a large fraction of the film thickness. This result means that the pentacene domains connect to each other only through several molecular layers on the bottom of the semiconductor film, suggesting poor cohesion among such domains.

The smoothness of the edge in a transferred semiconductor film is related to the shear strength of the semiconductor film. For example, a semiconductor film with high cohesion among domains would break in such a way that the cleavage, which creates new crystal surfaces, occupied as little surface area as possible. In this regard, the edge of diPr-PTTP is smooth even on a microscopic scale, as shown in FIG. 8. On the other hand, a film with poor grain cohesion such as pentacene can make a complex, less smooth edge. CuPc seems also to have insufficient cohesion, although it is composed of much finer grains than diPr-PTTP.

The hot melt transfer lamination processes disclosed herein can be used for manufacturing organic FETs at low cost and high processing speed. Processes that rely on an "upper" surface of a vapor-deposited organic semiconductor to form the channel can provide charge carrier mobility at least on the same order of magnitude as that of the "lower" surface, provided that the semiconductor is judiciously chosen. By "upper" in this regard is meant the initially-formed surface of a semiconductor film upon deposition of the semiconductor onto a donor substrate, which is subsequently exposed when the semiconductor film is transferred onto a receiver substrate. By "lower" in this regard is meant the initially-exposed outer surface of a semiconductor film after the film is formed on a donor substrate, which is subsequently adhered to a receiver substrate upon hot melt transfer of the semiconductor film.

While the present invention has been disclosed in a presently preferred context, it will be recognized that the present teachings may be adapted to a variety of contexts consistent with this disclosure and the claims that follow. For example, donor and receiver substrates having glass transitions consistent with the teachings herein can be formulated from other polymers, oligomers and monomers, including additives as desired. The heat needed to mobilize the semiconductor film from the donor to the receiver can be generated and applied in any manner suitable to take advantage of the differential glass transitions of the donor and receiver substrates. In addition to the broad definition of donor and receiver substrates above, such substrates can if desired be supported on or integral with further materials so long as the transfer of the semiconductor can be effectively carried out.

We claim:

1. A process for disposing an organic semiconductor film on a receiver substrate, comprising the steps of:
    depositing an organic semiconductor film onto a donor substrate, said semiconductor film having a first surface facing said donor substrate and having an exposed second surface;
    bringing the exposed second surface adjacent a receiver substrate such that the semiconductor film is in contact with both substrates; and
    then, moving the donor and receiver substrates apart; and
    wherein a surface portion of the receiver substrate is maintained above its glass transition during the moving step.

2. The process of claim 1, wherein a surface portion of the donating substrate is maintained below its glass transition during the moving step.

3. The process of claim 1, in which said second glass transition occurs at a temperature at least about 20° Kelvin below said first glass transition.

4. The process of claim 1, in which said second glass transition occurs at a temperature within a range of between about 280° Kelvin and about 300° Kelvin.

5. The process of claim 1, in which said first glass transition temperature occurs at a temperature within a range of between about 370° Kelvin and about 385° Kelvin.

6. The process of claim 1, in which said donor substrate has a surface energy within a range of between about 10 dynes/square centimeter and about 30 dynes/square centimeter.

7. The process of claim 1, in which said donor substrate has a surface energy within a range of between about 10 dynes/square centimeter and about 20 dynes/square centimeter.

8. The process of claim 1 in which said semiconductor is deposited as a vapor onto said donor substrate.

9. The process of claim 1 in which said semiconductor film is discontinuous.

10. The process of claim 1 in which said heat is provided at a temperature within a range of between about 50° C. and about 150° C.

11. The process of claim 1 in which said donor substrate comprises a member selected from the group consisting of poly(trifluoroethylmethacrylate), poly(cyclohexylmethacrylate), and poly(4-methylstyrene).

12. The process of claim 1 in which said receiver substrate comprises poly(butylmethacrylate).

13. The process of claim 1 in which said heat is applied through said donor substrate.

14. An active organic semiconductor device made by the process of claim 1.

* * * * *